(12) United States Patent
Poore et al.

(10) Patent No.: US 9,065,332 B2
(45) Date of Patent: Jun. 23, 2015

(54) POWER CONVERTER WITH FIRST AND SECOND RESONANT CIRCUITS

(75) Inventors: John W. Poore, South Pasadena, CA (US); Gene A. Bornzin, Simi Valley, CA (US)

(73) Assignee: PACESETTER, INC., Sylmar, CA (US)

( * ) Notice: Subject to any disclaimer, the term of this patent is extended or adjusted under 35 U.S.C. 154(b) by 236 days.

(21) Appl. No.: 13/361,736

(22) Filed: Jan. 30, 2012

(65) Prior Publication Data

US 2013/0193947 A1  Aug. 1, 2013

(51) Int. Cl.
  *H02M 7/5383* (2007.01)
  *H02M 3/145* (2006.01)
  *H03F 3/217* (2006.01)
  *H02M 3/155* (2006.01)
  *H02J 17/00* (2006.01)

(52) U.S. Cl.
  CPC ............ *H02M 3/145* (2013.01); *H03F 3/2176* (2013.01); *H02M 7/5383* (2013.01); *H02M 2003/1557* (2013.01); *H02J 17/00* (2013.01)

(58) Field of Classification Search
  CPC .......................... H02M 7/523; H03F 3/2176
  USPC ............. 363/131, 173, 59–60; 323/911, 229, 323/232–233
  See application file for complete search history.

(56) References Cited

U.S. PATENT DOCUMENTS 6,356,150 B1 *  3/2002  Spears et al. .................. 330/145
  2006/0217087 A1 *  9/2006  Snelgrove et al. ............ 455/126

OTHER PUBLICATIONS

Kazimierczuk, Marian and Puczko, Krzysztof; Class E Tuned Power Amplifer wiht Antiparalle Diode or Series Diode at Switch, with Any Loaded Q and Switch Duty Cycle; Sep. 1989; IEEE Transactions on Circuits and Systems, vol. 36, No. 9, pp. 1201-1209.*

Kazimierczuk, Marian and Jozwik, Jacek; Class E Zero-Voltage-Switching Rectifier with a Series Capacitor; Jun. 1989; IEEE Transactions on Circuits and Systems, vol. 36, No. 6, pp. 926-928.*

Lenaerts, Bert et al., "Omnidirectional Inductive Powering for Biomedical Implants," Dept. Electrical Engineering (ESAT), Katholieke Universiteit Leuven, Leuven Belgium. Springer Science + Business Media B.V. 2009:97-112.

Van Schuylenbergh, Koenraad et al., "Inductive Powering—Basic Theory and Application to Biomedical Systems," Dept. Electrical Engineering (ESAT-MICAS), Katholieke Universiteit Leuven, Leuven, Belgium. Springer Science + Business Media B.V. 2009:127-137.

* cited by examiner

*Primary Examiner* — Harry Behm (57) ABSTRACT

A high voltage resonant step-up convertor converts a lower voltage signal to a higher voltage signal. The converter may be used, for example, to supply power via electromagnetic coupling to an implantable medical device. In some embodiments, a power converter comprises a driver circuit and a resonant circuit. The resonant circuit generates a high voltage output signal at a selected frequency. The driver circuit is controlled by a low voltage signal and periodically generates a higher frequency signal (e.g., approximately twice the selected frequency) to drive the resonant circuit. In some embodiments, the driver circuit comprises another resonant circuit and a switching circuit. The switching circuit periodically pumps current to the other resonant circuit and isolates the two resonant circuits. The other resonant circuit periodically pumps current to the output resonant circuit.

19 Claims, 9 Drawing Sheets

POWER CONVERTER WITH FIRST AND SECOND RESONANT CIRCUITS

TECHNICAL FIELD

This application relates generally to electronic circuitry and, more specifically but not exclusively, to power conversion circuitry.

BACKGROUND

Implantable devices may be employed in various applications. For example, an implantable sensing device may perform functions, such as sensing blood pressure, sensing cardiac signals, sensing neurological signals, and so on. In addition, an implantable stimulation device may perform functions, such as generating cardiac stimulation signals, generation neurological stimulation signals, and so on.

Advances in integrated circuit technology have resulted in the availability of very small, very low power, high density integrated circuits. This, in turn, has made it possible to produce very small implantable medical devices such as, for example, sensors and satellite pacers.

Although the amount of power required for such devices is typically very small, external power techniques may be employed for these devices to enable the use of relatively small batteries or no batteries at all. Accordingly, in some implementations, external power is transferred to an implanted medical device via an electromagnetic field generated by an external device. For example, power may be transferred from an external device to recharge a rechargeable battery of an implanted medical device. As another example, for implanted medical devices that obtain all power solely from an external device, power may be transferred from an external device to power the implanted medical device.

In practice, it may be relatively difficult to couple power to a small implantable medical device. This is because an externally applied electromagnetic field tends to be weakly coupled to an implanted medical device. To couple an external source of energy to an implanted medical device, a large external coil may be used to create a strong electromagnetic field over a large area. However, only a small portion of this field will pass through the implanted medical device. For example, in some cases, the coupling coefficient is on the order of 0.01%.

SUMMARY

A summary of several sample aspects of the disclosure follows. It should be appreciated that this summary is provided for the convenience of the reader and does not wholly define the breadth of the disclosure. For convenience, one or more aspects or embodiments of the disclosure may be referred to herein simply as "some aspects" or "some embodiments."

The disclosure relates in some aspects to converting a lower voltage signal to a higher voltage signal. In some embodiments the teachings herein are employed in a high voltage resonant step-up convertor. Such a converter may be used, for example, to supply power via electromagnetic coupling to an implantable medical device. For example, the converter may be used to generate a high voltage alternating current signal that drives a relatively large coil. Since such a converter is capable of generating a relatively strong electromagnetic field, significant energy may be coupled to even a very small implantable medical device (e.g., that has a relatively small receiving coil).

The disclosure relates in some aspects to a power converter comprising a driver circuit and a resonant circuit. The resonant circuit generates a high voltage output signal at a selected frequency. The driver circuit periodically generates a higher frequency signal (e.g., twice the selected frequency) to drive the resonant circuit. Here, the driver circuit is controlled by a low voltage signal. Through the use of these components, the power converter efficiently converts the low voltage signal to a much higher voltage output signal. For example, the power converter may achieve a step-up in voltage of at least an order of magnitude (e.g., by a factor of 10-50).

In some embodiments, the driver circuit comprises another resonant circuit and a switch circuit. This other resonant circuit has a higher (e.g., by a factor of two) resonant frequency than the resonant frequency of the output resonant circuit. The switching circuit, driven by the low voltage input signal, periodically supplies current to the other resonant circuit and periodically enables the other resonant circuit to supply current to (e.g., pump) the output resonant circuit. Thus, based on the low voltage input signal, the switching circuit periodically pumps the other resonant circuit and the other resonant circuit periodically pumps the output resonant circuit. Through the use of this periodic switching scheme, the power converter is able to provide the large step-up in voltage from the input voltage to the output voltage.

BRIEF DESCRIPTION OF THE DRAWINGS

These and other aspects of the disclosure will be more fully understood when considered with respect to the following detailed description, the appended claims, and the accompanying drawings, wherein:

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals may be used to denote like features throughout the specification and figures.

DETAILED DESCRIPTION

The description that follows sets forth one or more illustrative embodiments. It will be apparent that the teachings herein may be embodied in a wide variety of forms, some of which may appear to be quite different from those of the disclosed embodiments. Consequently, the specific structural and functional details disclosed herein are merely representative and do not limit the scope of the disclosure. For example, based on the teachings herein one skilled in the art should appreciate that the various structural and functional details disclosed herein may be incorporated in an embodiment independently of any other structural or functional details. Thus, an apparatus may be implemented or a method practiced using any number of the structural or functional details set forth in any disclosed embodiment(s). Also, an apparatus may be implemented or a method practiced using other structural or functional details in addition to or other than the structural or functional details set forth in any disclosed embodiment(s).

Figure 1:
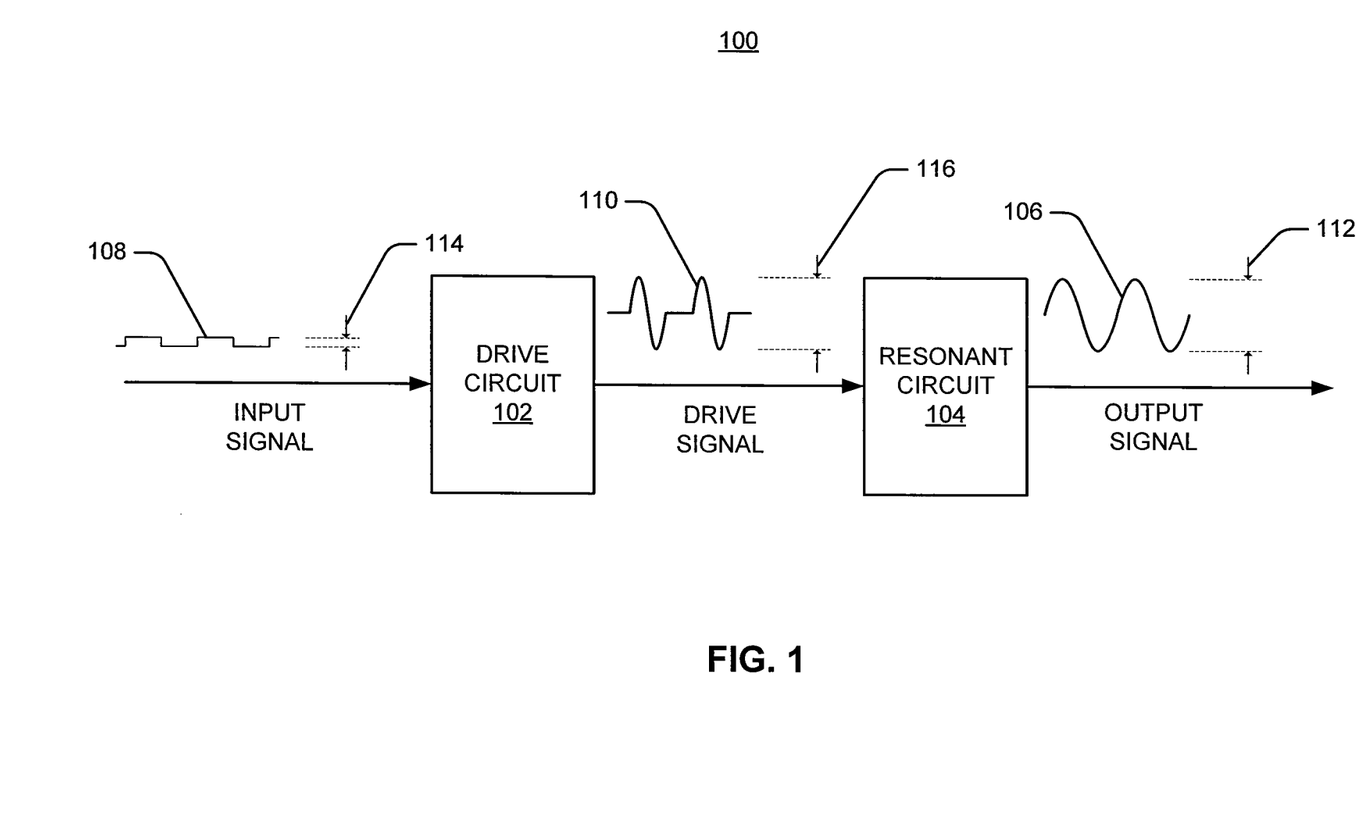
FIG. 1 is a simplified block diagram of an embodiment of a power converter circuit.

FIG. 1 illustrates an embodiment of a power converter apparatus 100 that includes a drive circuit 102 and a resonant circuit 104 for generating a high voltage alternating output signal 106 from a low voltage alternating input signal 108. The drive circuit 102 generates a high voltage drive signal 110 at periodic intervals based on the alternating input signal 108. The drive signal 110, in turn, serves to "pump" the resonant circuit 104 in a manner that enables the resonant circuit 104 to generate the high voltage output signal 106.

As discussed in more detail below, the drive signal 110 has a fundamental frequency that is approximately twice (e.g., within 20% of twice) the fundamental frequency of the output signal 106. That is, when the drive signal 110 is enabled, a signal of a specified fundamental frequency will drive the resonant circuit 104 which is operating at its lower fundamental frequency (i.e., approximately its resonant frequency). When the drive signal 110 is not enabled (i.e., the flat portion of the waveform for the drive signal 110), the drive circuit 102 does not drive the resonant circuit 104. In this latter case, the resonant circuit 104 is allowed to free-run at its fundamental frequency.

As shown in FIG. 1 (and also in FIG. 4), the fundamental frequency of the input signal 108 is approximately equal to (e.g., within 5% of) the fundamental frequency of the output signal 106. The frequency and duty cycle of the input signal 106 facilitates the "pumping" of the resonant circuit 104 with the drive signal 110 at appropriate times.

As used herein, the term fundamental frequency relates to the primary frequency of a signal, in contrast with minor signal components (e.g., harmonics, noise, etc.) that may also appear in a signal in a practical system. For example, the signal generated by a resonant circuit will generally be observed to be of a certain frequency (in practice, there may be a slight variation in this frequency over time). For purposes herein, the frequency of this observed signal can be considered to be the fundamental frequency.

As mentioned above, the power converter apparatus 100 generates an output signal 106 that has a higher voltage magnitude (e.g., peak-to-peak voltage) than the input signal 108. As discussed in more detail below, this step-up in voltage is accomplished in an efficient manner through the operation of the drive circuit 102 generating the drive signal 110 to pump the resonant circuit 104.

This scheme enables the power converter apparatus 100 to achieve a step-up of an order of magnitude (i.e., 10 times) or greater in some embodiments. For example, the voltage magnitude 112 of the output signal 106 may exceed the voltage magnitude 114 of the input signal 108 by a factor of 10-50 in some embodiments. In some embodiments, to achieve this step-up in voltage, the drive circuit 102 generates the drive signal 110 with a voltage magnitude 116 that is approximately equal to the voltage magnitude 112 of the output signal 106.

Figure 2:
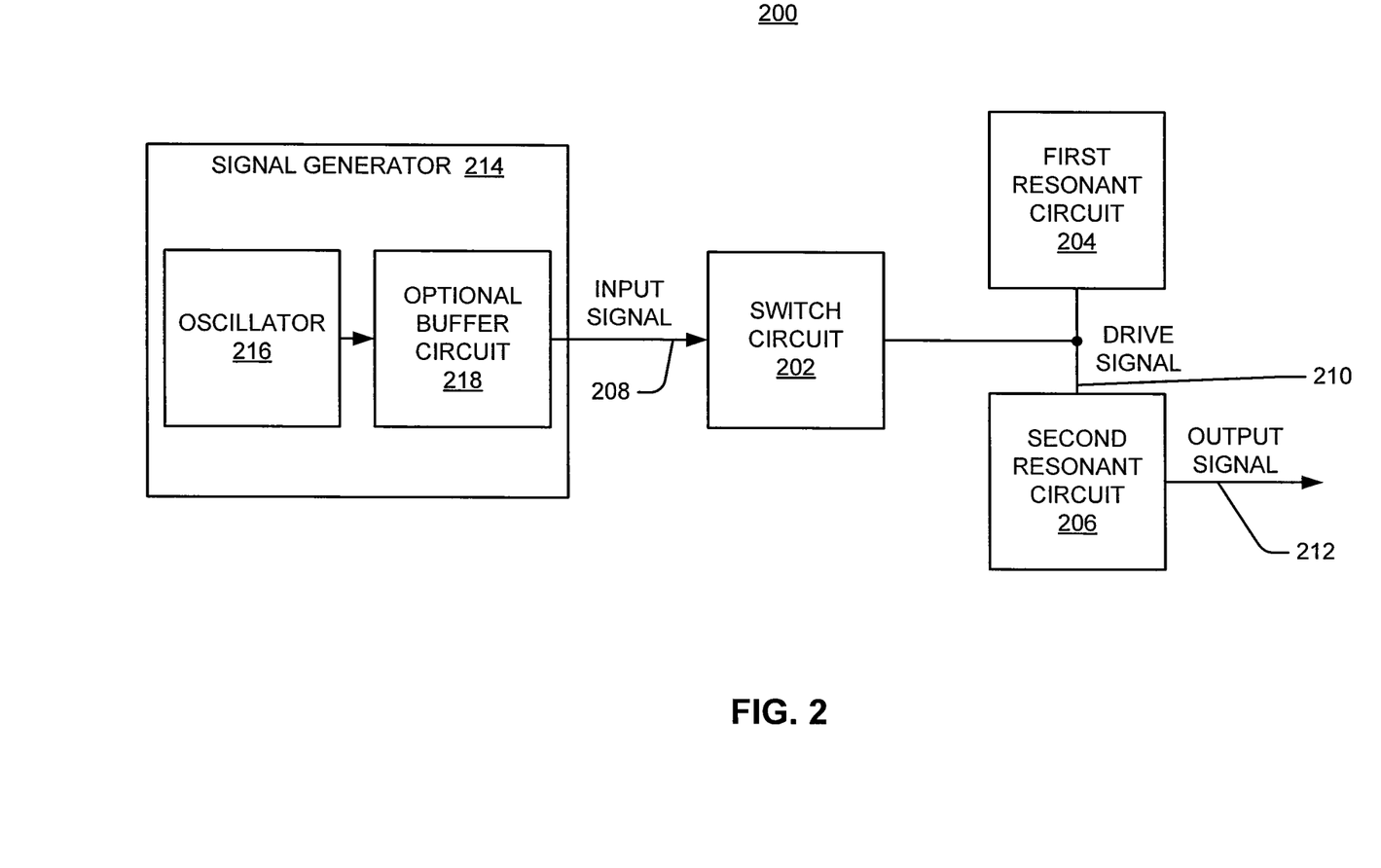
FIG. 2 is a simplified block diagram of an embodiment of a power converter circuit.

FIG. 2 illustrates a more detailed embodiment of a power converter apparatus 200. In some embodiments, several of the components of the power converter apparatus 200 correspond to the components of the power converter apparatus 100. For example, a switch circuit 202 and a first resonant circuit 204 may correspond to the drive circuit 102, and the second resonant circuit 206 may correspond to the resonant circuit 104. In this case, the input signal 108, the drive signal 110, and the output signal 106 of FIG. 1 would appear on the signal paths (e.g., electrical conductors) 208, 210, and 212, respectively, in the embodiment of FIG. 2.

FIG. 2 illustrates an embodiment where a signal generator 214 generates an input signal provided on the signal path 208. Here, an oscillator 216 generates an alternating signal that is optionally buffered by a buffer circuit 218 to provide the input signal. In some embodiments, the buffer circuit 218 provides an initial step-up in voltage. For example, the output of the oscillator 216 may have a voltage magnitude of 5 volts while the output of the buffer circuit 218 (i.e., the input signal) may have a voltage magnitude of 10 volts.

The switch circuit 202 is periodically turned on and off based on the input signal present on the signal path 208. When the switch circuit 202 is turned on, the switch circuit 202 supplies current to (i.e., pumps) the first resonant circuit 204 and isolates the first resonant circuit 204 from the second resonant circuit 206. As a result of this isolation, the second resonant circuit 206 is able to free-run at its resonant frequency. When the switch circuit 202 is turned off, the first resonant circuit 204 supplies current to (i.e., pumps) the second resonant circuit 206 via the signal path 210 to enable the second resonant circuit 206 to maintain a desired output voltage on the signal path 212.

The first resonant circuit 204 has a resonant frequency that is approximately twice (e.g., within 20% of twice) the resonant frequency of the second resonant circuit 206. When the switch circuit 202 is turned on, the first resonant circuit 204 is isolated from the second resonant circuit 206 and its current flow is established via the switch circuit. Then, when the switch circuit 202 is turned off, the first resonant circuit 204 is able to free-run at its resonant frequency while supplying current to the second resonant circuit 206. Accordingly, the drive signal provided at signal path 210 provides, at periodic intervals, a signal having a first fundamental frequency, while the continuous output signal provided by the second resonant circuit 206 at signal path 212 has a second fundamental frequency that is approximately half the first fundamental frequency.

Figure 4:
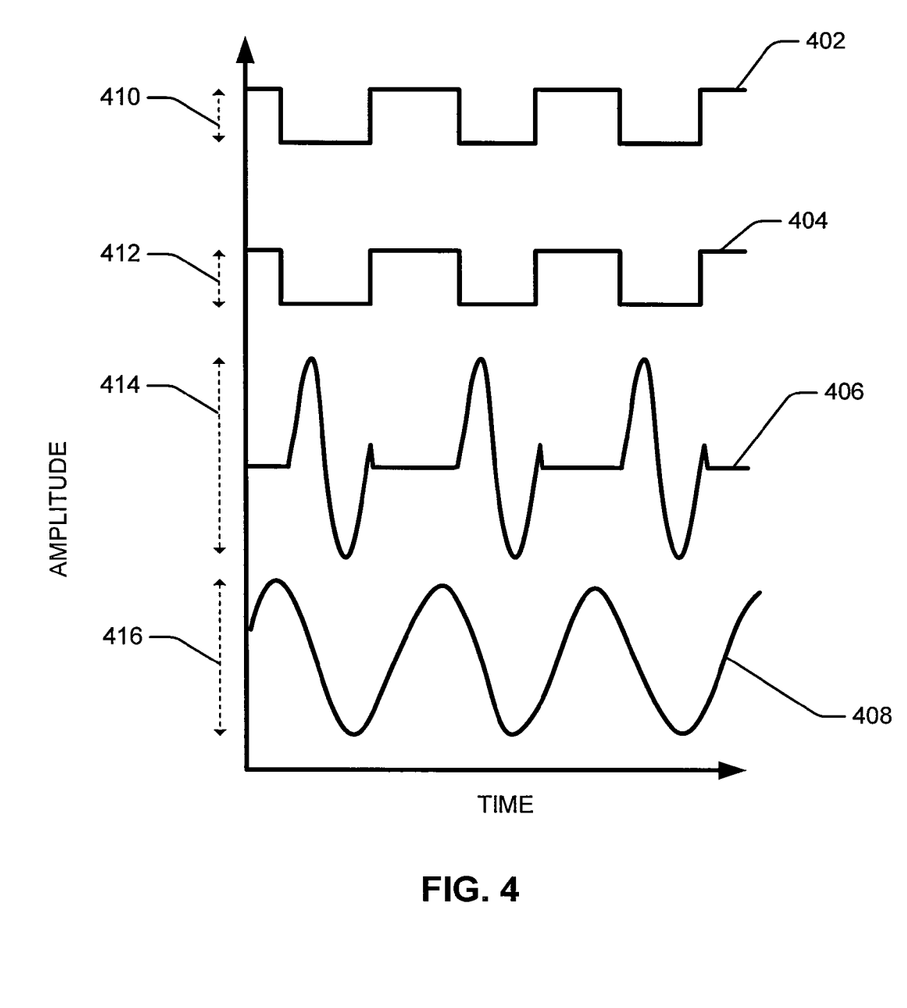
FIG. 4 is a simplified timing diagram of sample signals of a power converter circuit.

In the above example, the first fundamental frequency is approximately equal to the resonant frequency of the first resonant circuit 204 and the second fundamental frequency is approximately equal to the resonant frequency of the second resonant circuit 204. Here, any difference between a fundamental frequency and the resonant frequency of the corresponding resonant circuit may be due to, for example, interaction of the resonant circuit with other circuit components. FIG. 4, discussed below, presents a set of waveforms that illustrate an example of frequency relationships that may exist between the input signal, the drive signal, and the output signal in accordance with the teachings herein.

In the above example, the second resonant circuit 206 is operating at a frequency (i.e., the second fundamental frequency) that is near or at the resonant frequency of the second resonant circuit 206. Accordingly, the impedance of the second resonant circuit 206 is very high at this frequency. In contrast, the impedance of the first resonant circuit 204 at this frequency may be much lower since this frequency is much lower than the resonant frequency of the first resonant circuit 204. In some embodiments, the impedance of the second resonant circuit 206 is an order of magnitude higher that the impedance of the first resonant circuit 204 here. Consequently, the action of the first resonant circuit 204 pumping current into the much higher impedance of the second resonant circuit 206 results in a large voltage at the second resonant circuit 206, thereby providing the very large step-up in voltage discussed herein.

Figure 3:
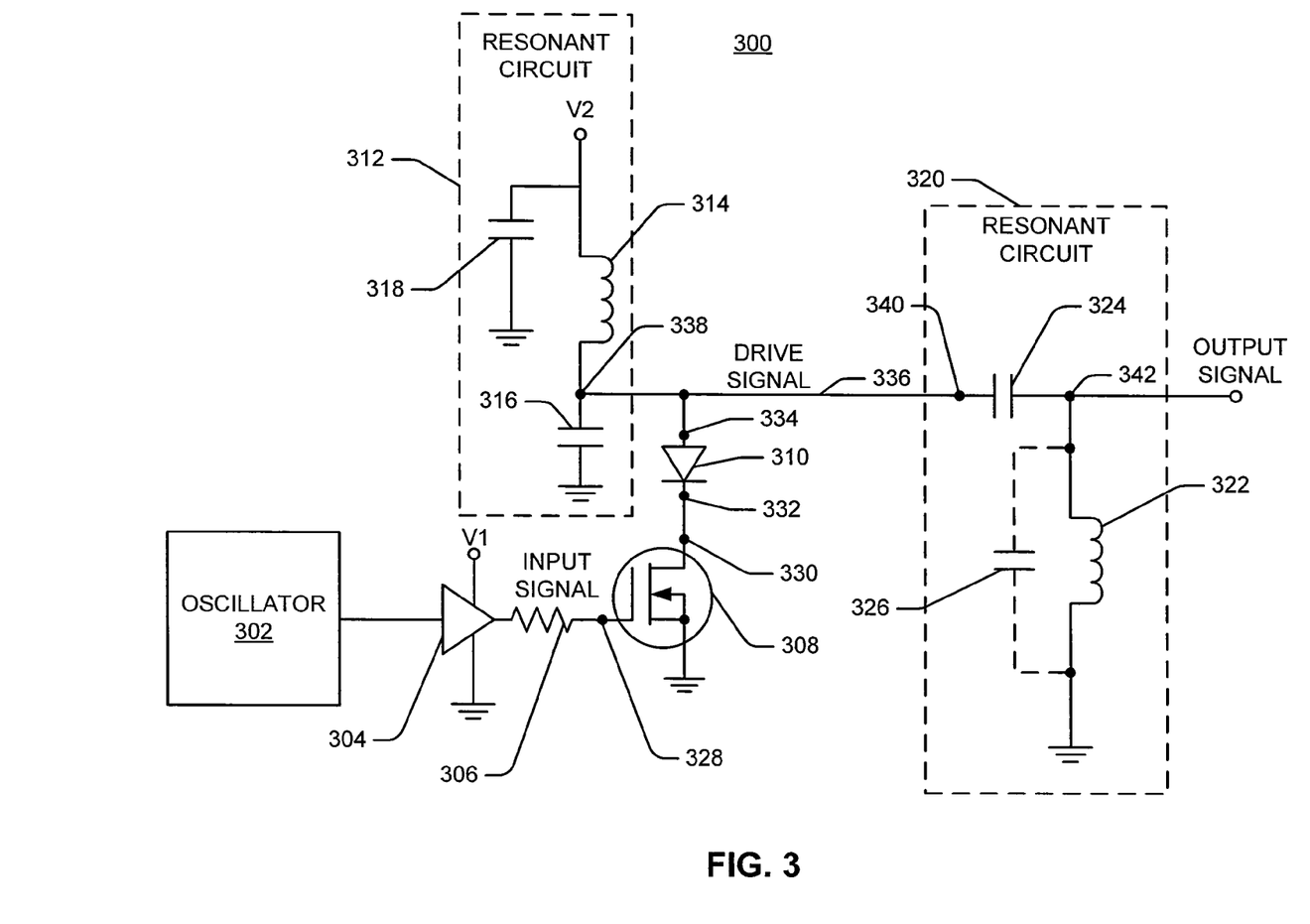
FIG. 3 is a simplified schematic diagram of an embodiment of a power converter circuit.

FIG. 3 is a schematic diagram of an embodiment of a power converter apparatus 300. The components of the power converter apparatus 300 illustrate one example of how the components of the power converter apparatus 200 of FIG. 2 may be implemented. An oscillator 302, a driver 304 (e.g., a high speed, low impedance MOSFET drive buffer), and a resistor 306 correspond to the signal generator 214. A transistor circuit 308 (comprising a single MOSFET in this example) and a diode circuit 310 (comprising a single diode in this example) correspond to the switch circuit 202. In some aspects, the diode circuit 310 serves to prevent high levels of reverse current flow through a protection diode (not shown) in the transistor circuit 308. A resonant circuit 312 comprising an inductor 314 and a capacitor 316 in series corresponds to the first resonant circuit 204. Typically, other capacitance of the apparatus 300 as represented by a filter capacitor 318 will have some impact on the operating frequency of resonant circuit 312. A resonant circuit 320 comprising an inductor 322 and a capacitor 324 in parallel with inductor 322 corresponds to the second resonant circuit 206. Typically, the self capacitance of the inductor 322 as represented by a capacitor 326 will have impact on the operating frequency of the resonant circuit 320.

Corresponding signal paths for the input signal, the drive signal, and the output signal are also shown in FIG. 3. The transistor circuit 308 comprises a first terminal 328 that receives the input signal. A second terminal 330 of the transistor circuit 308 is coupled to a second terminal 332 of the diode circuit 310. A first terminal 334 of the diode circuit 310 is coupled to at least one conductor 336 that couples a first terminal 338 of the resonant circuit 312 to a first terminal 340 of the resonant circuit 320. The output signal is provided via a second terminal 342 of the resonant circuit 320.

Different power supply voltages may be employed in the power converter apparatus 300 to facilitate the generation of the high voltage output signal. For example, in some embodiments, a power supply voltage V1 of 10 volts supplies power to the buffer 304 and a power supply voltage V2 of 20 volts supplies power to the resonant circuit 312. Other power supply voltages may be used in other embodiments.

Different values for the passive components may be employed in different embodiments. Sample values that may be employed in an embodiment that employs approximately a 125 kilohertz resonant frequency for the resonant circuit 320 and approximately a 250 kilohertz resonant frequency for the resonant circuit 312 follow: capacitor 316: 1.23 nanofarads; inductor 314: 330 microhenries; capacitor 318: 100 microfarads; capacitor 324: 20 picofarads; inductor 322: 9.6 millihenries; capacitance 326: 152 picofarads.

In an embodiment where the power converter apparatus 300 is used to couple power to an implanted medical device, the inductor 322 would preferably have the maximum number of turns possible (to provide good RF power coupling), while still having an acceptable self resonant frequency (e.g., above 125 kilohertz). For example, if the self resonance of the inductor 322 is 131 kilohertz, the parallel combination of the inductor 322 with the capacitance 326 may look inductive at 125 kilohertz (the frequency at which the inductor 322 will resonate with the capacitor 324).

For purposes of illustration, the inductances and capacitances of the power converter apparatus 300 are depicted as being single passive components. It should be appreciated, however, that a given capacitance or inductance may be implemented by a more complex capacitive circuit or inductive circuit, respectively, in some embodiments.

FIG. 4 illustrates an example of waveforms that may be generated in a power converter apparatus in accordance with the teachings herein. For purposes of illustration, the waveforms will be referenced to the power converter apparatus 300 of FIG. 3. A waveform 402 corresponds to the output of the oscillator 302 that provides a reference signal at approximately 125 kilohertz. A waveform 404 corresponds to the amplified output of the driver 304 (e.g., the input signal). A waveform 406 corresponds to the voltage on the capacitor 316 (e.g., the drive signal). A waveform 408 corresponds to the voltage on the inductor 322 (e.g., the output signal).

FIG. 4 illustrates that a very high step-up in voltage may be achieved by driving the resonant output inductor 322 at the 250 kilohertz drive frequency and, by operation of the diode circuit 310, allowing essentially complete freewheeling of the resonant circuit 312 when the transistor circuit 308 is turned off. The input signal causes the transistor circuit 308 to periodically turn on (a high level in FIG. 4) for 4 microseconds and turn off (a low level in FIG. 4) for 4 microseconds. When the transistor circuit 308 turns on, current is supplied to the resonant circuit 312 via the transistor circuit 308 (e.g., current is pulled through the inductor 314 thereby "charging" it). In addition, during this state, the voltage at the input terminal 340 for the resonant circuit 320 is approximately 0 volts (e.g., as indicated by the flat portions of the waveform 406). Hence, the first resonant circuit 312 and the second resonant circuit 322 are effectively isolated at this time. When the transistor circuit 308 turns off, the resonant circuit 312 is able to free-run at its resonant frequency (thereby allowing the resonant circuit 312 to have one complete cycle of 250 kilohertz oscillation). This single cycle of 250 kilohertz oscillation enhances a half cycle of the oscillation of the resonant circuit 320. Here, appropriately timed current flow from the resonant circuit 312 serves to aid the oscillations of the resonant circuit 322 at its resonant frequency (e.g., approximately 125 kilohertz). For example, in FIG. 4 it may be seen that the time of the maximum positive voltage on the waveform 406 corresponds to the time of the maximum downward voltage swing on the waveform 408.

Through the above action, the output waveform 408 may have a much larger magnitude than the input waveform 404. For example, in a sample embodiment, the magnitude 410 of the waveform 402 may be 5 volts, the magnitude 412 of the waveform 404 may be 10 volts, the magnitude 414 of the waveform 406 may be approximately 750 volts, and the magnitude 416 of the waveform 408 may be approximately 650 volts. It should be appreciated that other voltage levels may apply in other embodiments. For example, with a 20 volt input signal it may be possible to achieve a 1 kilovolt output voltage.

Figure 5:
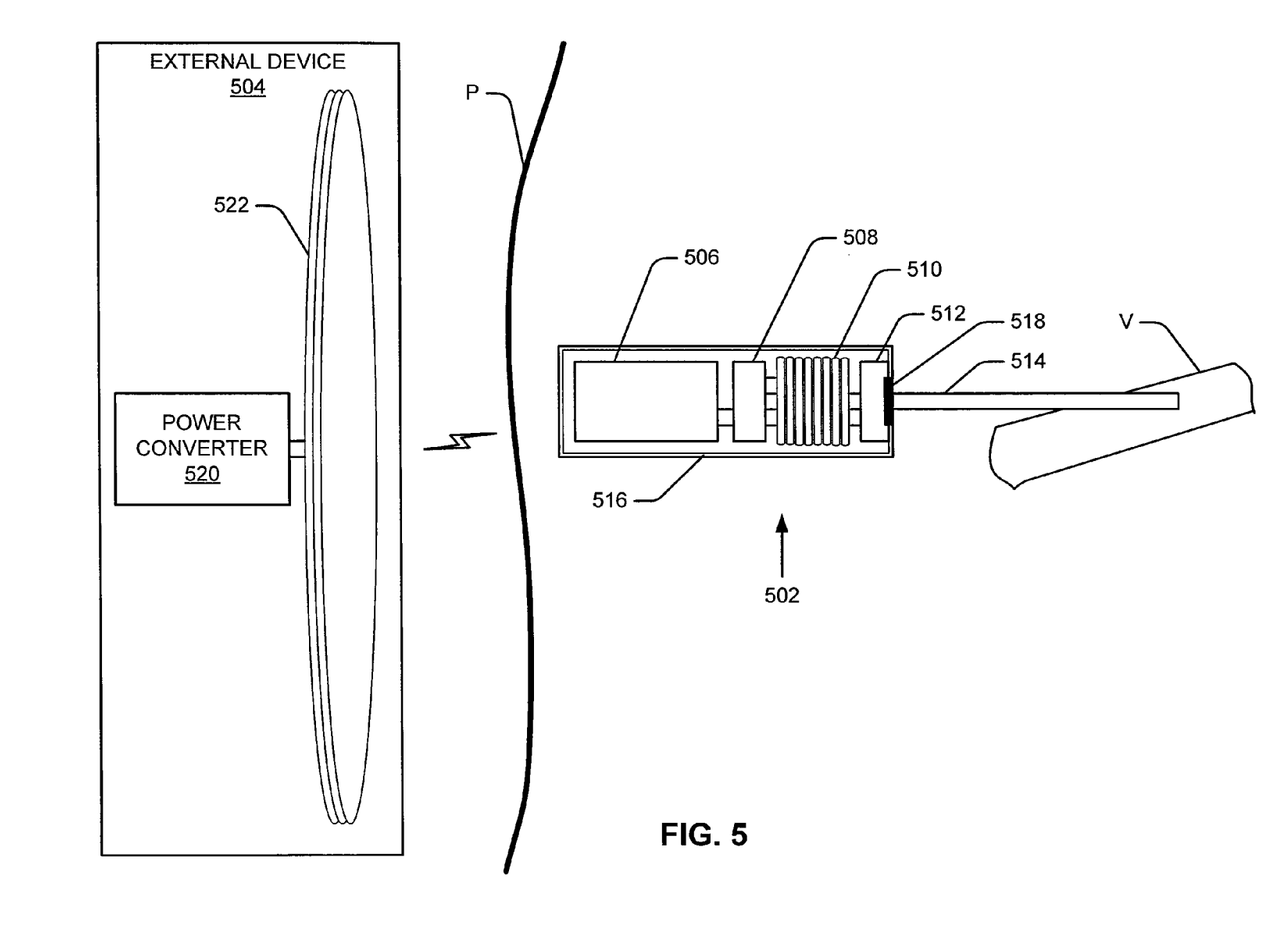
FIG. 5 is a simplified diagram of an embodiment of a power coupling system where electromagnetic energy generated by an external device is coupled to an implantable medical device that provides sensing functionality.

As mentioned above, a power converter apparatus as described herein may be employed to provide power to an implanted medical device. FIG. 5 is a simplified diagram of an embodiment of a sensor device 502 implanted in a patient P. The sensor device 502 includes a rechargeable battery 506, control circuitry 508, a coil antenna 510, a pressure transducer 512, a thin protruding tube 514, and a biocompatible housing 516. In the example, of FIG. 5, the tube 514 is inserted into a blood vessel V (e.g., a vein, an artery, a chamber, etc.) of the patient P to measure blood pressure at that location. The sensor device 502 may be fixed in place within the patient P by means of sutures, an active fixation device, passive fixation, or some suitable fixation technique (fixation means not shown in FIG. 5). The pressure transducer 512 includes a flexible diaphragm 518 or some other suitable component that is able to detect pressure that is transferred via the tube 514 (or some other suitable structure). For example, the flexible diaphragm 518 may be in fluid communication with the interior space of the tube 514 (e.g., which may be filled with a gel) such that pressure induced in the vessel V is imparted via the interior space of the tube 514 to the flexible diaphragm 518.

In some implementations, the sensor device 502 has dimensions on the order of: 5-6 millimeters in diameter or less and 10 millimeters in length or less. Thus, the sensor device 502 may be implanted into a patient using so-called minimally invasive techniques (e.g., injection techniques).

The rechargeable battery 506 is recharged through the use of an external device 504. For example, through the use of a power converter 520 constructed in accordance with the teachings herein, the external device 504 may generate a strong 125 kilohertz external electromagnetic field via an antenna coil 522 (e.g., 12 centimeters in diameter) that is coupled to receive the output signal from the output resonant circuit of the power converter 520.

The coil 510 is relatively small (e.g., 3 millimeters in diameter) due to the small size of the sensor device 502. Thus, assuming approximately 10 centimeter spacing between the coils 522 and 510, the coupling between these coils may be on the order of 0.01%. Through the use of a power converter constructed in accordance with the teachings herein, a strong enough signal (e.g., greater than 500 volts peak-to-peak) may be efficiently produced at the external device 504 to generate sufficient energy at the coil 510 and thereby charge the battery 506 and/or power other circuitry of the implanted sensor device 502.

Figure 6:
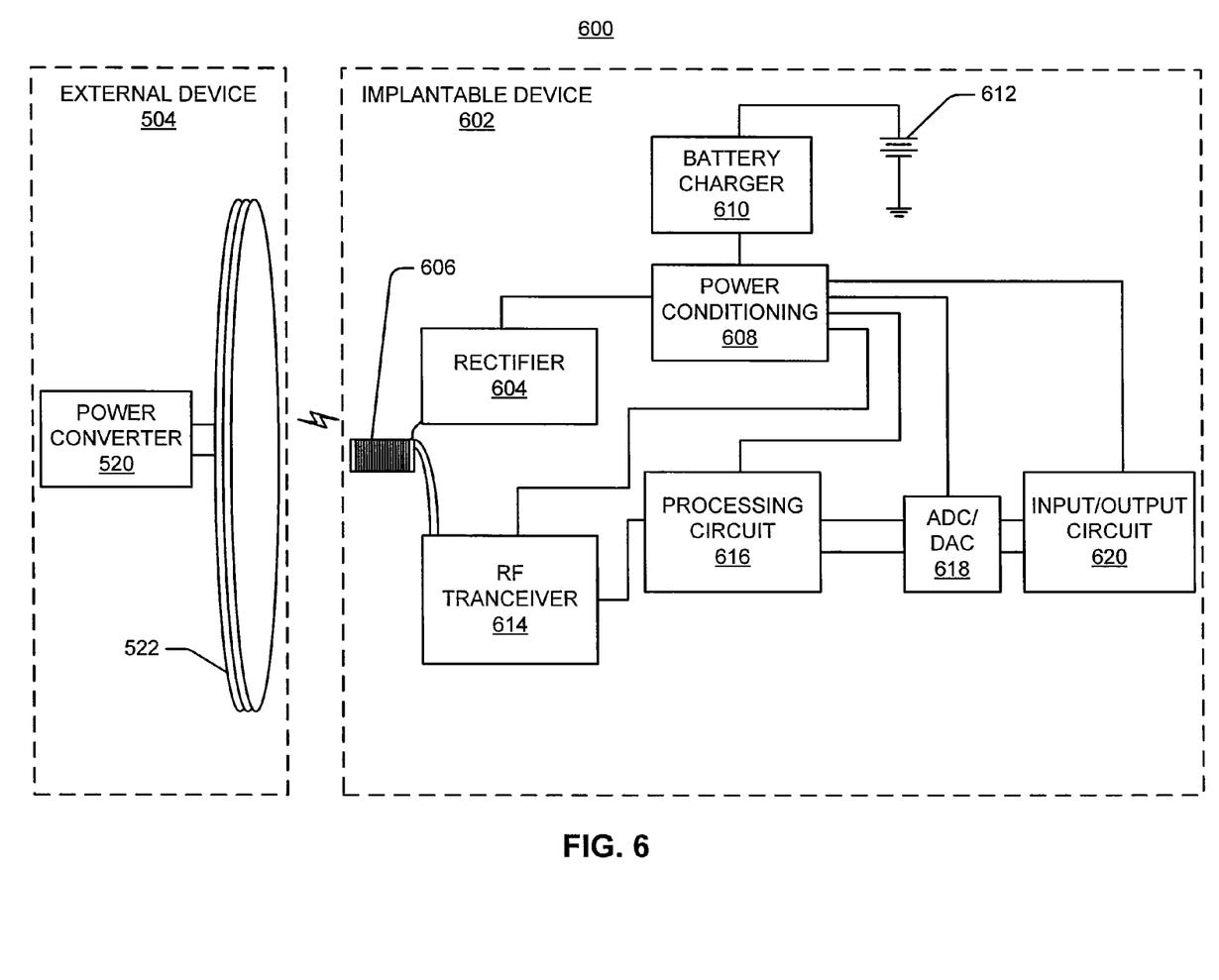
FIG. 6 is a simplified diagram of an embodiment of a power coupling system where electromagnetic energy generated by an external device is coupled to an implantable medical device.

FIG. 6 is a simplified block diagram of an example of an implantable device 602 that may use received electromagnetic energy to recharge a battery or directly power internal circuitry. For purposes of illustration, it is assumed that this energy is received from the external device 504 of FIG. 5.

A rectifier 604 rectifies RF signals received via an antenna coil 606 and provides a rectified output signal to a power conditioning circuit 608. The power conditioning circuit 608 may perform simple capacitive filtering or more robust filtering to generate a substantially DC rectified signal.

In some embodiments, the rectified signal is provided to a battery charger circuit 610 that charges a rechargeable battery 612. In this case, power from the battery 612 is then provided to other circuitry of the implantable device 602.

In some embodiments, however, energy received via the antenna coil 606 is used to directly power internal circuitry of the implantable device 602. For example, the power conditioning circuit 608 may supply power directly to an RF transceiver 614, a processing circuit 616, an ADC/DAC circuit 618, and an input/output circuit 620.

Figure 7:
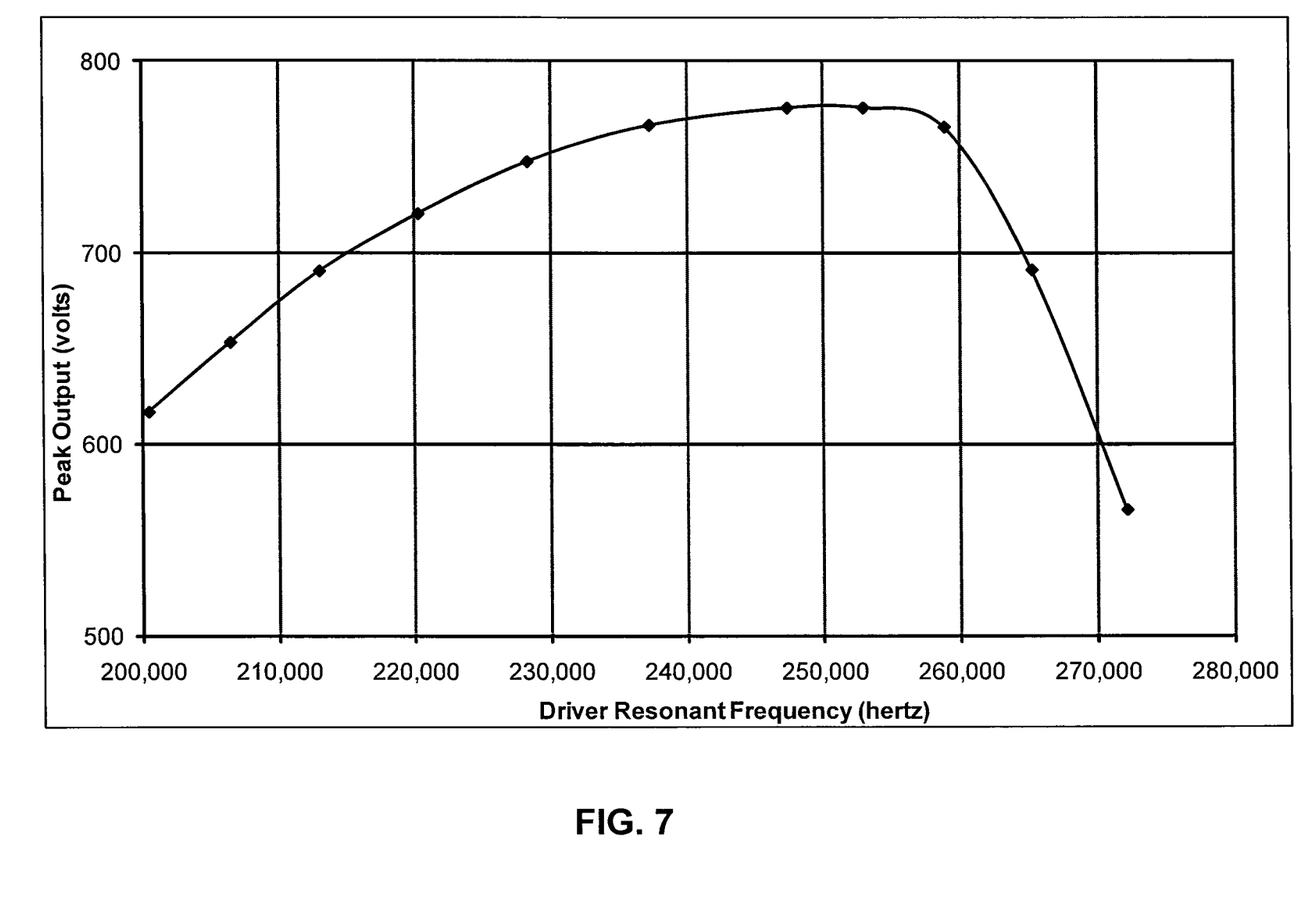
FIG. 7 is a simplified diagram illustrating a sample relationship between peak output and driver resonant frequency.
Figure 8:
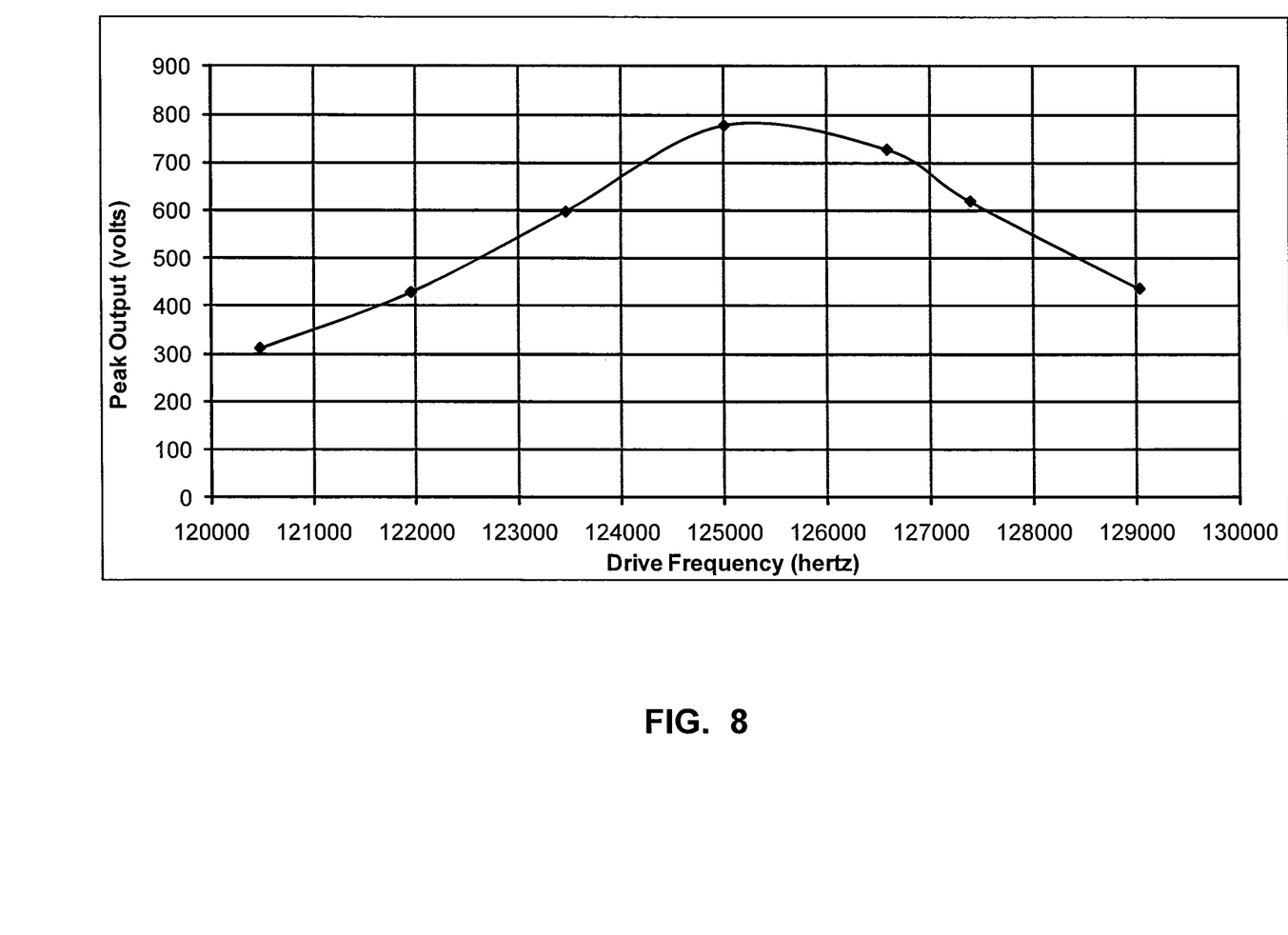
FIG. 8 is a simplified diagram illustrating a sample relationship between peak output and drive frequency.
Figure 9:
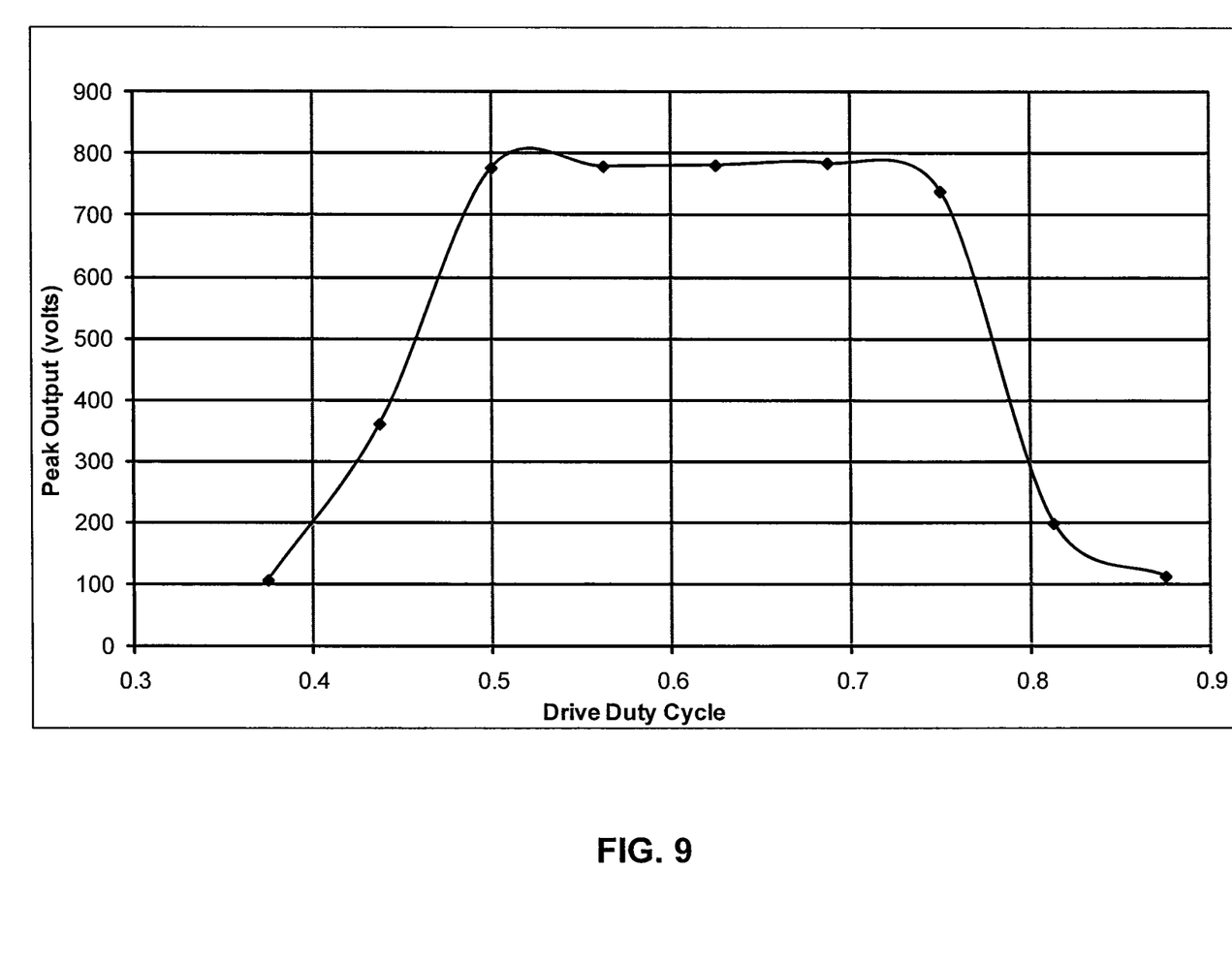
FIG. 9 is a simplified diagram illustrating a sample relationship between peak output and drive duty cycle.

FIGS. 7-9 are simplified simulation results that illustrate that a power converter constructed in accordance with the teachings herein may effectively operate under a variety of operation conditions and/or with a variety of design parameters.

FIG. 7 illustrates an example of how the peak output may vary with changes in the driver resonant frequency (e.g., changes in the resonant frequency of the resonant circuit 312 due to changes in the value of the inductor 314). Here, it may be seen that a relatively large output voltage may be achieved for a given input voltage even when the resonant frequency of the resonant circuit 312 is varied by 10%, 20%, or more.

FIG. 8 illustrates an example of how the peak output may vary with changes in the drive frequency (e.g., changes in the frequency of the oscillator 302). Here, it may be seen that relatively large output voltage may be achieved for a given input voltage even when the frequency of the input signal varies by 5% or more.

FIG. 9 illustrates an example of how the peak output may vary with changes in the drive duty cycle (e.g., changes in the duty cycle of the oscillator 302). Here, it may be seen that relatively large output voltage may be achieved for a given input voltage even when the duty cycle of the input signal varies by 20% or more.

A power converter apparatus may be implemented in a variety of ways in accordance with the teachings herein. In some implementations, the apparatus may operate with an output frequency (e.g., the second fundamental frequency discussed above) in the range of 1 kilohertz to 1.5 megahertz. In some implementations, such an apparatus may more effectively operate with an output frequency in the range of 10 kilohertz to 1 megahertz. Also, in implementations where the capacitors of the resonant circuits are subjected to very high voltages (e.g., hundreds of volts), the capacitors may be constructed of a very low loss dielectric.

It should be appreciated that various modifications may be incorporated into the disclosed embodiments based on the teachings herein. For example, the structure and functionality taught herein may be incorporated into types of devices other than the specific types of devices described above. In addition, a high voltage signal generated in accordance with the teachings herein may be used in various types of applications. Also, a resonant circuit, a drive circuit, a switch circuit, and a diode circuit may be implemented in various ways to provide a power conversion apparatus as taught herein.

It should be appreciated from the above that the various structures and functions described herein may be incorporated into a variety of apparatuses (e.g., a charging device, a monitoring device, etc.) and implemented in a variety of ways. Different embodiments of such an apparatus may include a variety of hardware and software processing components. In some embodiments, hardware components such as processors, controllers, state machines, logic, or some combination of these components, may be used to implement the described components or circuits.

In some embodiments, code including instructions (e.g., software, firmware, middleware, etc.) may be executed on one or more processing devices to implement one or more of the described functions or components. The code and associated components (e.g., data structures and other components used by the code or used to execute the code) may be stored in an appropriate data memory that is readable by a processing device (e.g., commonly referred to as a computer-readable medium).

The components and functions described herein may be connected or coupled in many different ways. The manner in which this is done may depend, in part, on whether and how the components are separated from the other components. In some embodiments some of the connections or couplings represented by the lead lines in the drawings may be in an integrated circuit, on a circuit board or implemented as discrete wires or in other ways.

In general, components may be coupled with or without intervening components. For example, a first component may be coupled to a second component via a conductor or via a conductor and at least one intervening component (e.g., a resistor, a capacitor, etc.). The term direct coupling may be used herein to describe a coupling where there are no intervening components (e.g., other than a conductor that provides the coupling).

The signals discussed herein may take various forms. For example, in some embodiments a signal may comprise electrical signals transmitted over a wire, light pulses transmitted through an optical medium such as an optical fiber or air, or RF waves transmitted through a medium such as air, and so on. In addition, a plurality of signals may be collectively referred to as a signal herein. The signals discussed above also may take the form of data. For example, in some embodiments an application program may send a signal to another application program. Such a signal may be stored in a data memory.

Moreover, the recited order of the blocks in the processes disclosed herein is simply an example of a suitable approach. Thus, operations associated with such blocks may be rearranged while remaining within the scope of the present disclosure. Similarly, the accompanying method claims present operations in a sample order, and are not necessarily limited to the specific order presented.

Also, it should be understood that any reference to elements herein using a designation such as "first," "second," and so forth does not generally limit the quantity or order of those elements. Rather, these designations may be used herein as a convenient method of distinguishing between two or more different elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements."

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While certain embodiments have been described above in detail and shown in the accompanying drawings, it is to be understood that such embodiments are merely illustrative of and not restrictive of the teachings herein. In particular, it should be recognized that the teachings herein apply to a wide variety of apparatuses and methods. It will thus be recognized that various modifications may be made to the illustrated embodiments or other embodiments, without departing from the broad scope thereof. In view of the above it will be understood that the teachings herein are intended to cover any changes, adaptations or modifications which are within the scope of the disclosure.

What is claimed is:

1. A power conversion apparatus, comprising:
    a drive circuit configured to generate, at periodic intervals, a drive signal having a first fundamental frequency, wherein the drive signal is generated based on an alternating input signal having a first voltage magnitude; and
    a first resonant circuit coupled to the drive circuit and configured to generate, based on the drive signal, an output signal at a second voltage magnitude that is greater than the first voltage magnitude, wherein the output signal has a second fundamental frequency that is approximately half the first fundamental frequency, wherein the drive circuit comprises a switch coupled to a second resonant circuit, wherein the switch supplies current to the second resonant circuit when the switch is turned on, the second resonant circuit being configure to provide the drive signal to the first resonant circuit when the switch is turned off.

2. The apparatus of claim 1, wherein the second voltage magnitude is at least an order of magnitude greater than the first voltage magnitude.

3. The apparatus of claim 1, wherein the drive circuit comprises a second resonant circuit of the apparatus that is configured to provide the drive signal and that has a resonant frequency that is approximately equal to the first fundamental frequency.

4. The apparatus of claim 3, wherein:
    the drive circuit comprises a switch circuit controlled by the input signal; and
    the switch circuit periodically supplies current to the second resonant circuit at times corresponding to the periodic intervals.

5. The apparatus of claim 4, wherein the switch circuit periodically isolates the first resonant circuit from the second resonant circuit at times corresponding to the periodic intervals.

6. The apparatus of claim 3, wherein, at the second fundamental frequency, an impedance of the first resonant circuit is higher than an impedance of the second resonant circuit.

7. The apparatus of claim 1, wherein the first fundamental frequency is within 20% of twice the second fundamental frequency.

8. The apparatus of claim 1, wherein the input signal has a fundamental frequency that is approximately equal to the second fundamental frequency.

9. The apparatus of claim 1, wherein the second fundamental frequency is within a range of 10 kilohertz to 1 megahertz.

10. The apparatus of claim 1, further comprising an antenna coupled to receive the output signal from the first resonant circuit, wherein the antenna is configured to generate an electromagnetic field based on the output signal.

11. A power conversion apparatus, comprising:
    a first resonant circuit comprising an inductor and a capacitor in series and a first terminal and a second terminal, wherein the capacitor of the first resonant circuit is coupled between the first terminal and the second terminal of the first resonant circuit;
    a second resonant circuit comprising an inductor and capacitor in series and a first terminal, the first terminal of the second resonant circuit is coupled between the inductor and the capacitor of the second resonant circuit;
    at least one conductor that couples the first terminal of the first resonant circuit to the first terminal of the second resonant circuit;
    a diode circuit comprising a first terminal and a second terminal, wherein the first terminal of the diode circuit is coupled to the at least one conductor;
    a transistor circuit comprising a first terminal and a second terminal; and
    at least one conductor that couples the second terminal of the diode circuit to the second terminal of the transistor circuit, wherein the first resonant circuit has a resonant frequency; and the second resonant circuit has a resonant frequency that is approximately twice the resonant frequency of the first resonant circuit.

12. The apparatus of claim 11, wherein the transistor circuit is a field-effect transistor.

13. The apparatus of claim 11, wherein the resonant frequency of the second resonant circuit is within 20% of twice the resonant frequency of the first resonant circuit.

14. The apparatus of claim 11, wherein, at the resonant frequency of the first resonant circuit, an impedance of the first resonant circuit is higher than an impedance of the second resonant circuit.

15. The apparatus of claim 11, wherein, at the resonant frequency of the first resonant circuit, an impedance of the first resonant circuit is at least an order of magnitude higher than an impedance of the second resonant circuit.

16. The apparatus of claim 11, wherein, based on a periodic input signal at the first terminal of the transistor circuit, the transistor circuit periodically supplies current to the second resonant circuit and periodically isolates the first resonant circuit from the second resonant circuit.

17. The apparatus of claim 11, wherein:
the first resonant circuit generates an output signal at the second terminal of the first resonant circuit; and
the output signal has a voltage magnitude that is at least an order of magnitude greater than a voltage magnitude of an input signal at the first terminal of the transistor circuit.

18. The apparatus of claim 17, wherein:
the second resonant circuit generates a drive signal at a first fundamental frequency at the first terminal of the second resonant circuit;
based on the drive signal, the first resonant circuit generates the output signal at a second fundamental frequency that is approximately half the first fundamental frequency; and
the input signal has a fundamental frequency that is approximately equal to the second fundamental frequency.

19. The apparatus of claim 11, further comprising an antenna coupled to receive an output signal from the second terminal of the first resonant circuit, wherein the antenna is configured to generate an electromagnetic field based on the output signal.

* * * * *